United States Patent
Jain et al.

(10) Patent No.: US 11,063,139 B2
(45) Date of Patent: Jul. 13, 2021

(54) HETEROJUNCTION BIPOLAR TRANSISTORS WITH AIRGAP ISOLATION

(71) Applicant: GLOBALFOUNDRIES U.S. Inc., Santa Clara, CA (US)

(72) Inventors: Vibhor Jain, Essex Junction, VT (US); John J. Pekarik, Underhill, VT (US); Qizhi Liu, Lexington, MA (US); Judson Holt, Ballston Lake, NY (US)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 0 days.

(21) Appl. No.: 16/748,055

(22) Filed: Jan. 21, 2020

(65) Prior Publication Data
US 2021/0091213 A1 Mar. 25, 2021

Related U.S. Application Data

(60) Provisional application No. 62/904,235, filed on Sep. 23, 2019.

(51) Int. Cl.
| | |
|---|---|
| *H01L 29/737* | (2006.01) |
| *H01L 29/06* | (2006.01) |
| *H01L 29/66* | (2006.01) |
| *H01L 29/10* | (2006.01) |
| *H01L 29/08* | (2006.01) |

(52) U.S. Cl.
CPC ........ *H01L 29/737* (2013.01); *H01L 29/0649* (2013.01); *H01L 29/0821* (2013.01); *H01L 29/1004* (2013.01); *H01L 29/66242* (2013.01)

(58) Field of Classification Search
CPC ............... H01L 29/737; H01L 29/1004; H01L 29/0649; H01L 29/0821; H01L 29/66242
See application file for complete search history.

(56) References Cited

U.S. PATENT DOCUMENTS

| | | | |
|---|---|---|---|
| 6,940,149 | B1 | 9/2005 | Divakaruni et al. |
| 8,067,290 | B2 | 11/2011 | Boeck et al. |
| 8,395,217 | B1 | 3/2013 | Cheng et al. |
| 9,029,229 | B2 | 5/2015 | Adkisson et al. |
| 9,070,734 | B2 | 6/2015 | Camillo-Castillo et al. |
| 9,159,817 | B2 | 10/2015 | Camillo-Castillo et al. |
| 9,202,900 | B2 | 12/2015 | Adkisson et al. |

(Continued)

OTHER PUBLICATIONS

V. T. Vu, D. Celi, T. Zimmer, S. Fregonese and P. Chevalier, "Advanced Si/SiGe HBT architecture for 28-nm FD-SOI BiCMOS," 2016 IEEE Bipolar/BiCMOS Circuits and Technology Meeting (BCTM), New Brunswick, NJ, 2016, pp. 64-67.

*Primary Examiner* — Syed I Gheyas
(74) *Attorney, Agent, or Firm* — Thompson Hine LLP; Anthony Canale

(57) ABSTRACT

Structures for a heterojunction bipolar transistor and methods of forming a structure for a heterojunction bipolar transistor. A collector layer includes an inclined side surface, and a dielectric layer is positioned in a lateral direction adjacent to the inclined side surface of the collector layer. An intrinsic base is disposed over the collector layer, and an emitter is disposed over the intrinsic base. An airgap is positioned between the dielectric layer and the inclined side surface of the collector layer in the lateral direction, and an extrinsic base is positioned in the lateral direction adjacent to the intrinsic base. The extrinsic base is positioned over the airgap.

20 Claims, 5 Drawing Sheets

(56) References Cited

U.S. PATENT DOCUMENTS

| | | |
|---|---|---|
| 9,245,951 B1 | 1/2016 | Camillo-Castillo et al. |
| 9,318,551 B2 | 4/2016 | Camillo-Castillo et al. |
| 9,368,608 B1 | 6/2016 | Camillo-Castillo et al. |
| 9,653,566 B2 | 5/2017 | Camillo-Castillo et al. |
| 2014/0353725 A1* | 12/2014 | Adkisson .......... H01L 29/66242 257/197 |

* cited by examiner

HETEROJUNCTION BIPOLAR TRANSISTORS WITH AIRGAP ISOLATION

CROSS-REFERENCE TO RELATED APPLICATIONS

This application claims the benefit of U.S. Provisional Application No. 62/904,235, filed Sep. 23, 2019, which is hereby incorporated by reference herein in its entirety.

BACKGROUND

The invention relates generally to semiconductor devices and integrated circuit fabrication and, in particular, to structures for a heterojunction bipolar transistor and methods of forming a structure for a heterojunction bipolar transistor.

A bipolar junction transistor is a multi-terminal electronic device that includes an emitter, a collector, and an intrinsic base arranged between the emitter and collector. In a PNP bipolar junction transistor, the emitter and collector are composed of p-type semiconductor material, and the intrinsic base is composed of n-type semiconductor material. In an NPN bipolar junction transistor, the emitter and collector are composed of n-type semiconductor material, and the intrinsic base is composed of p-type semiconductor material. In operation, the base-emitter junction is forward biased, the base-collector junction is reverse biased, and the collector-emitter current may be controlled with the base-emitter voltage.

A heterojunction bipolar transistor is a variant of a bipolar junction transistor in which the semiconductor materials of the terminals have different energy bandgaps, which creates heterojunctions. For example, the collector and/or emitter of a heterojunction bipolar transistor may be constituted by silicon, and the intrinsic base of a heterojunction bipolar transistor may be constituted by silicon-germanium, which is characterized by a narrower band gap than silicon.

Although existing structures for a heterojunction bipolar transistor have proven suitable for their intended purpose, improved structures for a heterojunction bipolar transistor and methods of forming a structure for a heterojunction bipolar transistor are needed.

SUMMARY

In an embodiment of the invention, a structure for a heterojunction bipolar transistor is provided. The structure includes a collector layer having an inclined side surface, a dielectric layer positioned in a lateral direction adjacent to the inclined side surface of the collector layer, an intrinsic base over the collector layer, and an emitter over the intrinsic base. The structure further includes an airgap positioned between the dielectric layer and the inclined side surface of the collector layer in the lateral direction, and an extrinsic base positioned in the lateral direction adjacent to the intrinsic base. The extrinsic base is positioned over the airgap.

In an embodiment of the invention, a method of forming a heterojunction bipolar transistor is provided. The method includes patterning a trench extending through a device layer and a buried insulator layer of a silicon-on-insulator substrate to a handle wafer, and epitaxially growing a collector layer from the handle wafer and inside the trench. The collector layer includes an inclined side surface laterally adjacent to the buried insulator layer. The method further includes epitaxially growing a semiconductor layer of an extrinsic base from a section of the device layer bordering the trench. The semiconductor layer extends laterally from the device layer to the inclined side surface of the collector layer. An airgap is bounded by the buried insulator layer, the inclined side surface of the collector layer, and the semiconductor layer.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
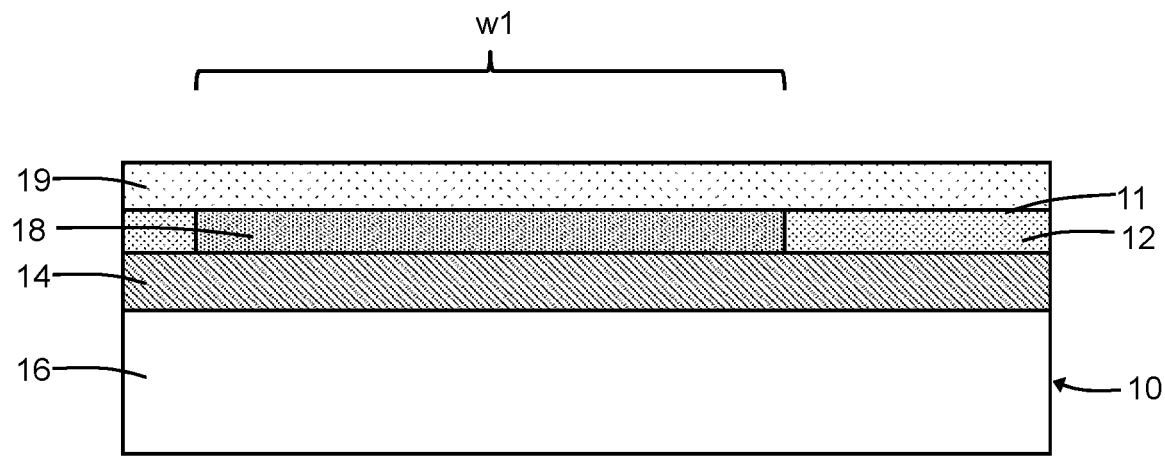
FIGS. 1-7 are cross-sectional views of a structure at successive fabrication stages of a processing method in accordance with embodiments of the invention.

With reference to FIG. 1 and in accordance with embodiments of the invention, a substrate 10 in the representative form of a semiconductor-on-insulator (SOI) substrate includes a device layer 12 defining a semiconductor layer, a buried insulator layer 14 providing a dielectric layer, and a handle wafer 16. The device layer 12 is separated from the handle wafer 16 by the intervening buried insulator layer 14 and may be considerably thinner than the handle wafer 16. The device layer 12 and the handle wafer 16 may be composed of a single-crystal semiconductor material, such as single-crystal silicon, and may be lightly doped to have, for example, p-type conductivity, and the buried insulator layer 14 may be composed of a dielectric material, such as silicon dioxide. The buried insulator layer 14 has a lower surface in direct contact with the handle wafer 16 along an interface and an upper surface in direct contact with the device layer 12 along another interface, and the lower and upper surfaces are separated by the thickness of the buried insulator layer 14 and terminate at the rim of the substrate 10. The device layer 12 is electrically isolated from the handle wafer 16 by the buried insulator layer 14, and the buried insulator layer 14 is positioned directly on the handle wafer 16. The device layer 12 has a thickness, t1, between the buried insulator layer 14 and its top surface 11. In an embodiment, the thickness of the device layer 12 may range from about 3 nanometers (nm) to about 200 nm.

A doped region 18 having a given conductivity type is formed in the device layer 12. The doped region 18 may be formed by introducing a dopant of the given conductivity type by, for example, ion implantation into a portion of the device layer 12. A patterned implantation mask may be used to define a selected location for the doped region 18 and is stripped after the doped region 18 is formed. In an embodiment, the semiconductor material of the doped region 18 may comprise a p-type dopant (e.g., boron) that produces p-type conductivity. Implantation conditions (e.g., kinetic energy and dose) are selected to form the doped region 18 with a desired doping profile and concentration. In an embodiment, the doped region 18 may be constituted by heavily-doped semiconductor material formed through a selection of implantation conditions. The doped region 18 may extend in a vertical direction from the top surface 11 of the device layer 12 through the full thickness of the device layer 12 to the underlying buried insulator layer 14. The doped region 18 has a given width, w1, in a horizontal plane.

A hardmask 19 is formed over the device layer 12 after forming the doped region 18. The hardmask 19 may be a layer composed of a dielectric material, such as silicon nitride.

Figure 2:
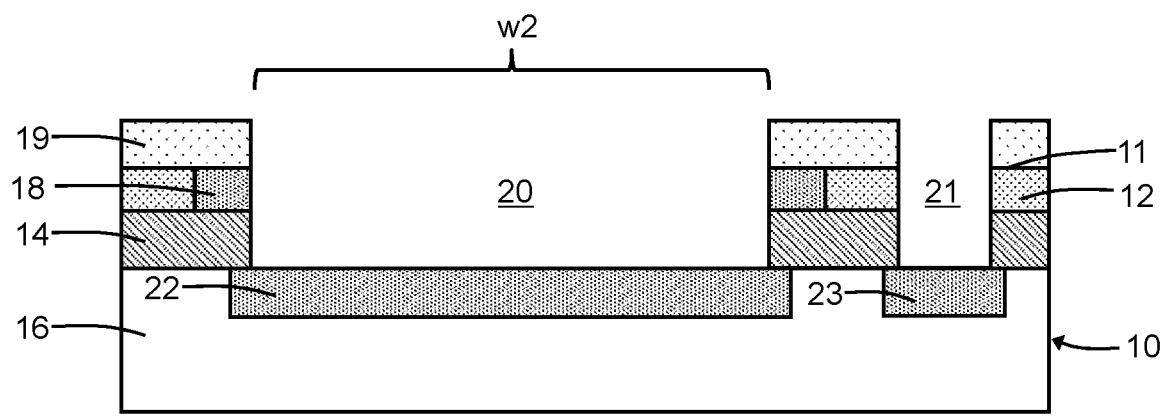

With reference to FIG. 2 in which like reference numerals refer to like features in FIG. 1 and at a subsequent fabrication stage of the processing method, the hardmask 19 is patterned with lithography and etching processes to define an opening that is aligned with and located over the doped region 18. A trench 20 is formed at the location of the opening in the hardmask 19. The trench 20 extends fully through the device layer 12 and fully through the buried insulator layer 14 to the handle wafer 16. The trench 20 has a width, w2, in a horizontal plane that is less than the width of the doped region 18. Sections of the device layer 12 including the doped region 18 are exposed at the sidewalls of the trench 20.

A doped region 22 having a given conductivity type is formed in the handle wafer 16 after forming the trench 20. The doped region 22 may be formed by introducing a dopant of the given conductivity type by, for example, ion implantation into a portion of the handle wafer 16 that is aligned with the trench 20. A patterned implantation mask may be used to define the selected location for the doped region 22 and is stripped after the doped region 22 is formed.

In an embodiment, the semiconductor material of the doped region 22 may comprise an n-type dopant (e.g., arsenic or phosphorus) that produces n-type conductivity. Implantation conditions (e.g., kinetic energy and dose) are selected to form the doped region 22 with a desired doping profile and concentration. In an embodiment, the doped region 22 may be constituted by moderately-doped semiconductor material formed through a selection of the implantation conditions. An annealing process may be used to activate the dopant, which may widen the doped region 22 through diffusion to be wider in the horizontal plane than the width of the trench 20. The doped region 22 may provide a sub-collector of a heterojunction bipolar transistor structure.

Another trench 21 may be formed that is laterally spaced from the trench 20. The trench 21 also extends fully through the device layer 12 and fully through the buried insulator layer 14 to the handle wafer 16. Sections of the device layer 12 are exposed at the sidewalls of the trench 21. A doped region 23 is formed in the handle wafer 16 by the same ion implantation forming the doped region 22. The doped region 23 may merge with the doped region 22 due to dopant diffusion during thermal processes subsequent to their formation.

Figure 3:
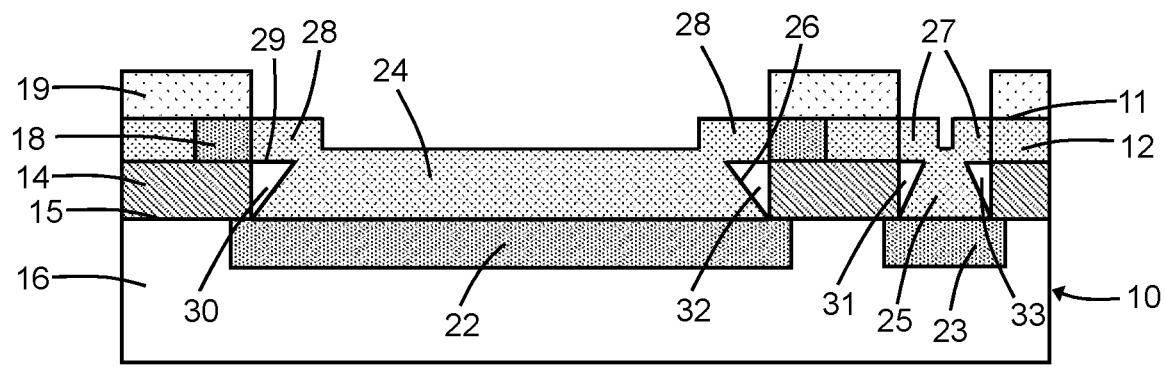

With reference to FIG. 3 in which like reference numerals refer to like features in FIG. 2 and at a subsequent fabrication stage of the processing method, a collector layer 24 is formed inside the trench 20 and over the doped region 22 in the handle wafer 16. The collector layer 24 may be composed of a semiconductor material, such as silicon. The collector layer 24 may be doped with a concentration of a dopant, such as an n-type dopant (e.g., arsenic or phosphorus) to provide n-type conductivity. The collector layer 24 may be formed using an epitaxial growth process and may contain single-crystal semiconductor material (e.g., single-crystal silicon). The epitaxial growth process may be selective in nature resulting in epitaxial growth over exposed semiconductor regions and not on dielectric materials, such as the hardmask 19. The crystal structure of the single-crystal semiconductor material of the handle wafer 16 serves as a crystalline template for the crystal structure of the single-crystal semiconductor material of the collector layer 24 established during epitaxial growth. The collector layer 24 may provide a collector of the heterojunction bipolar transistor structure.

The collector layer 24, which grows upwardly from the top surface 15 of the handle wafer 16, includes side surfaces 26 that are inclined at an angle, $\theta$, relative to a normal to the top surface 15 of the handle wafer 16. For example, the side surfaces 26 may be coextensive with the (111) planes of semiconductor material that is epitaxially grown with faceting from a [100]-oriented handle wafer 16 and that exhibits a higher growth rate along a <100> direction than other crystalline directions. The collector layer 24 is positioned directly on the portion of the handle wafer 16 that is exposed by the trench 20.

Semiconductor layers 28 also epitaxially grow from the sections of the device layer 12 located at the sidewalls of the trench 20. The semiconductor layers 28 extend from the sections of the device layer 12 in a lateral direction toward the collector layer 24, and the laterally-extending semiconductor layers 28 contact and merge with the collector layer 24 during epitaxial growth.

Due to the inclination of the side surfaces 26, airgaps 30, 32 representing voids or pockets are defined by the epitaxial growth of the semiconductor material. The airgaps 30,32 are laterally positioned between the buried insulator layer 14 and the inclined side surfaces 26 of the collector layer 24. The semiconductor layers 28 bridge the entrance to each of the airgaps 30, 32 as respective closures such that the entrance to each of the airgaps 30, 32 is fully occluded and closed by one of the semiconductor layers 28. The airgaps 30, 32 may be characterized by a permittivity or dielectric constant of near unity (i.e., vacuum permittivity). The airgaps 30, 32 may be filled by atmospheric air at or near atmospheric pressure, may be filled by another gas at or near atmospheric pressure, or may contain atmospheric air or another gas at a sub-atmospheric pressure (e.g., a partial vacuum). The airgap 30 and the airgap 32 may provide a substantially triangular shape that is bounded, in each instance, by a side surface 26 of the collector layer 24, a side surface of the buried insulator layer 14, and a lower side surface 29 of the semiconductor layer 28. The lower side surface 29 of one of the semiconductor layers 28 is coextensive with (i.e., shares a boundary with) the airgap 30, and the lower side surface 29 of the other of the semiconductor layers 28 is coextensive with the airgap 32. The airgaps 30, 32 are positioned in a vertical direction between the top surface 15 of the handle wafer 16 and the semiconductor layers 28, and in a lateral direction between the side surfaces 26 of the collector layer 24 and the buried insulator layer 14.

The semiconductor material also epitaxially grows from the handle wafer 16 at the base of the trench 21 and the device layer 12 at the sidewalls of the trench 21. The semiconductor material epitaxially-grown from the handle wafer 16 as semiconductor layer 25 includes inclined side surfaces similar to the side surfaces 26. Segments of the semiconductor material also epitaxially grow as semiconductor layers 27 from the sections of the device layer 12 at the sidewalls of the trench 21 and merge with the semiconductor layer 25 epitaxially-growing from the handle wafer 16. Airgaps 31, 33 similar to airgaps 30, 32 are defined inside the trench 21 and are enclosed by the epitaxially-grown semiconductor material of the semiconductor layers 25, 27. The airgaps 31, 33 are positioned in a vertical direction between the semiconductor layers 27 and the handle wafer 16. The airgaps 31, 33 are positioned in a lateral direction between the buried insulator layer 14 and the respective inclined surfaces of the semiconductor layers 25.

In an alternative embodiment, the trench 21 may be omitted and the formation of the sub-collector contact may later include etching a trench through the device layer 12 and buried insulator layer 14 to the handle wafer 16 after an emitter is formed and the lateral boundaries of the base are defined by lithography and etching. In this instance, the collector contact in the middle-of-line portion of the interconnect structure directly contacts the handle wafer 16 and not intervening portions of the semiconductor layers 25, 27.

Figure 4:
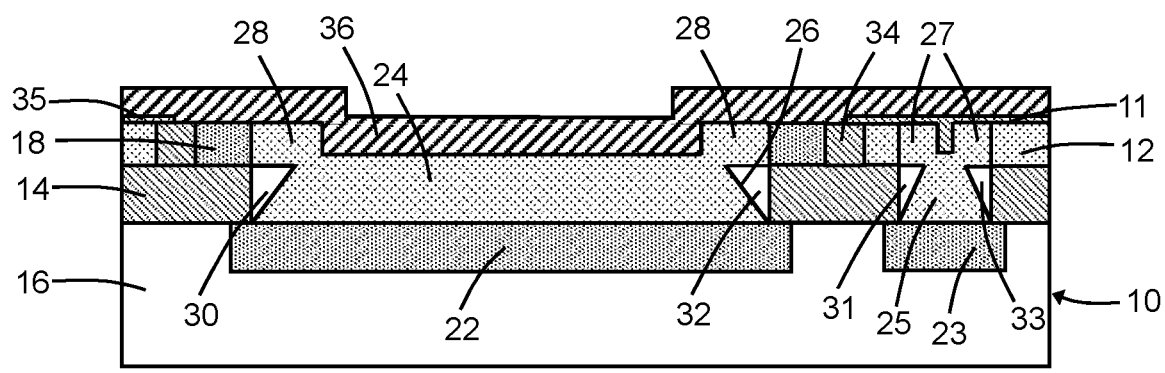

With reference to FIG. 4 in which like reference numerals refer to like features in FIG. 3 and at a subsequent fabrication stage of the processing method, the hardmask 19 is removed by, for example, an etching process. Shallow trench isolation regions 34 are formed that extend fully through the device layer 12 to the buried insulator layer 14 and that surround the trench 20. The shallow trench isolation regions 34 may be composed of a dielectric material, such as silicon dioxide. A protect layer 35 composed of, for example, silicon dioxide may be deposited and patterned that surrounds the doped region 18 and trench 20.

A base layer 36 is formed inside the trench 20 and over the collector layer 24 and semiconductor layers 28 of semiconductor material. The base layer 36 also extends over the sections of the doped region 18, the shallow trench isolation regions 34, and the protect layer 35. The base layer 36 may be formed using an epitaxial growth process and may contain single-crystal semiconductor material (e.g., single-crystal silicon and silicon-germanium). The crystal structure of the single-crystal semiconductor material of the collector layer 24 and semiconductor layers 28 of semiconductor material serves as a crystalline template for the crystal structure of the single-crystal semiconductor material of the base layer 36 established during epitaxial growth.

The base layer 36 may be composed of a semiconductor material, such as silicon-germanium (SiGe) including silicon and germanium combined with a silicon content ranging from 95 atomic percent to 50 atomic percent and a germanium content ranging from 5 atomic percent to 50 atomic percent. The germanium content of the base layer 36 may be uniform, or may be graded and/or stepped across its thickness. The base layer 36 may be doped with a concentration of a dopant, such as a p-type dopant (e.g., boron) to provide p-type conductivity. In an embodiment, the base layer 36 may include a sublayer of silicon that is grown from the collector layer 24, a subsequently-grown sub-layer of doped and graded silicon-germanium on the undoped sublayer of silicon, and a subsequently-grown sub-layer of silicon on the silicon-germanium sublayer.

Figure 5:
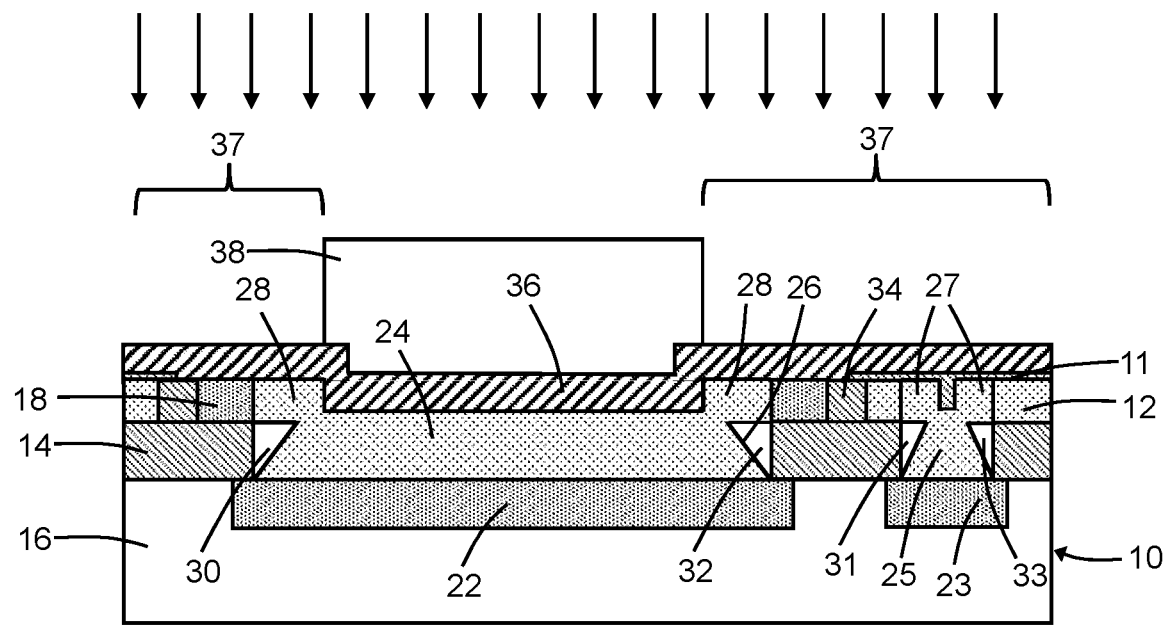

With reference to FIG. 5 in which like reference numerals refer to like features in FIG. 4 and at a subsequent fabrication stage of the processing method, an implantation mask 38 may be formed on the portion of the base layer over the collector layer 24. The implantation mask 38 may include a layer of photoresist applied by a spin-coating process, prebaked, exposed to light projected through a photomask, baked after exposure, and developed with a chemical developer. The unmasked sections 37 of the base layer 36 may be doped by, for example, ion implantation with ions, as diagrammatically indicated by the dashed single-headed arrows, of a p-type dopant (e.g., boron) that provides p-type conductivity. The implantation conditions (e.g., ion species, dose, kinetic energy) may be selected to tune the electrical and physical characteristics (e.g., electrical resistivity and depth profile) of the extrinsic base. The unmasked sections 37 of the base layer 36 may also be implanted with carbon and/or germanium of which the former may inhibit diffusion of the implanted dopant and the latter may act as a preamorphization implant that lowers the base resistance. The implantation mask 38 may be stripped after performing the implantation(s).

Figure 6:
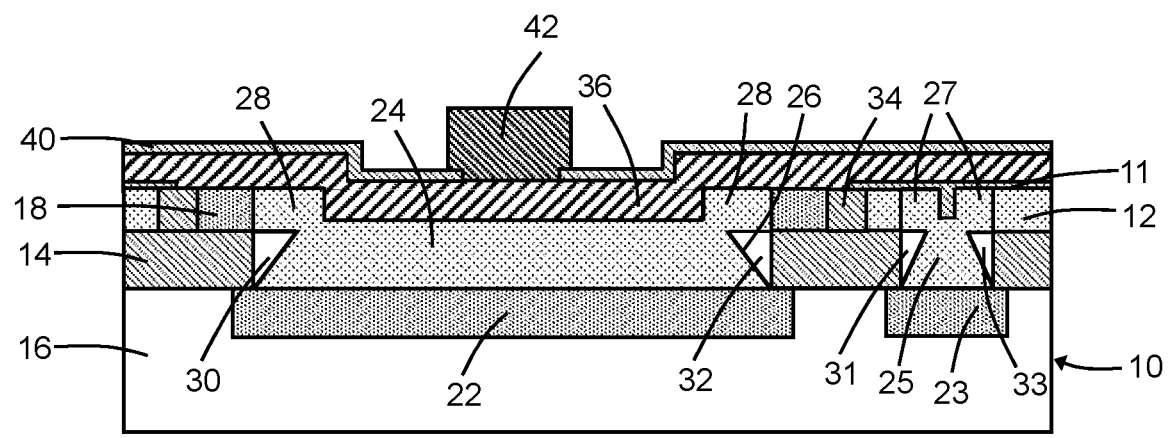

With reference to FIG. 6 in which like reference numerals refer to like features in FIG. 5 and at a subsequent fabrication stage of the processing method, a dielectric layer 40 is deposited over the base layer 36 and patterned with lithography and etching processes to provide an emitter window as an opening extending to the base layer 36 over the collector layer 24. The dielectric layer 40 may be composed of a dielectric material, such as silicon dioxide, deposited by atomic layer deposition or chemical vapor deposition.

An emitter 42 is formed that extends through the emitter window in the dielectric layer 40 to contact the base layer 36. The emitter 42 may be formed by depositing a blanket semiconductor layer and patterning the blanket semiconductor layer with lithography and etching processes. The emitter 42 may be composed of polycrystalline semiconductor material, such as polycrystalline silicon, deposited by chemical vapor deposition. In an embodiment, the emitter 42 may be in situ doped during deposition with an n-type dopant (e.g., phosphorus or arsenic) to provide n-type conductivity.

Figure 7:
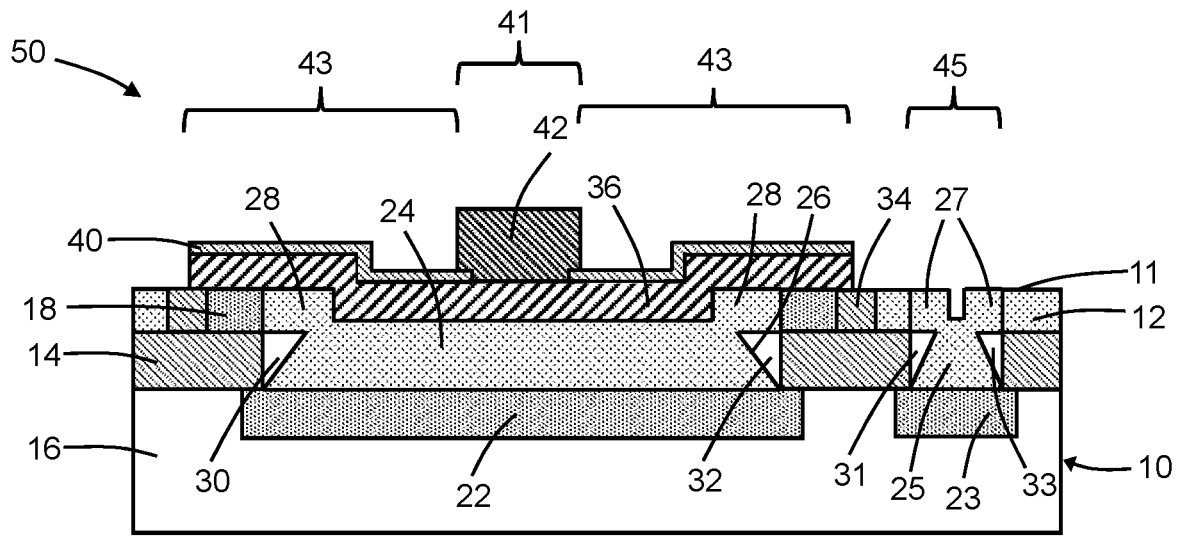

With reference to FIG. 7 in which like reference numerals refer to like features in FIG. 6 and at a subsequent fabrication stage of the processing method, a device structure 50 for a heterojunction bipolar transistor is defined by patterning the dielectric layer 40 and the base layer 36 with lithography and etching processes. The completed device structure 50 has a vertical architecture that includes the collector layer 24, the emitter 42, and an intrinsic base 41 provided by the portion of the base layer 36 that is arranged vertically between the emitter 42 and collector layer 24. Junctions are arranged between the emitter 42 and the intrinsic base 41 and between the intrinsic base 41 and the collector layer 24. The device structure 50 can be divided into an intrinsic region that includes the junctions, and an extrinsic region that is arranged outside of the intrinsic region.

The device structure 50 further includes an extrinsic base 43 in the extrinsic region that is used to contact the intrinsic base. The extrinsic base 43 may collectively include the portions of the base layer 36 doped by implantation, the sections of the device layer 12 including the doped region 18, and the semiconductor layers 28 of semiconductor material. The semiconductor layers 25, 27 in the trench 21 are located in a sub-collector contact region 45 and may be used to contact the doped region 18 providing the sub-collector.

Middle-of-line processing and back-end-of-line processing follow, which includes formation of contacts, vias, and wiring for an interconnect structure that is coupled with the device structure 50.

Because of the electrical isolation furnished by the introduction of the airgaps 30, 32 between the collector layer 24 and a portion of the extrinsic base 43, the collector-base capacitance of the device structure 50 may be reduced. The permittivity of the airgaps 30, 32 is less than that permittivity of the solid material that would otherwise occupy the space. The reduction in the collector-base capacitance may improve operational figures of merit, such as maximum frequency, transit frequency, and gain, of the device structure 50.

Figure 8:
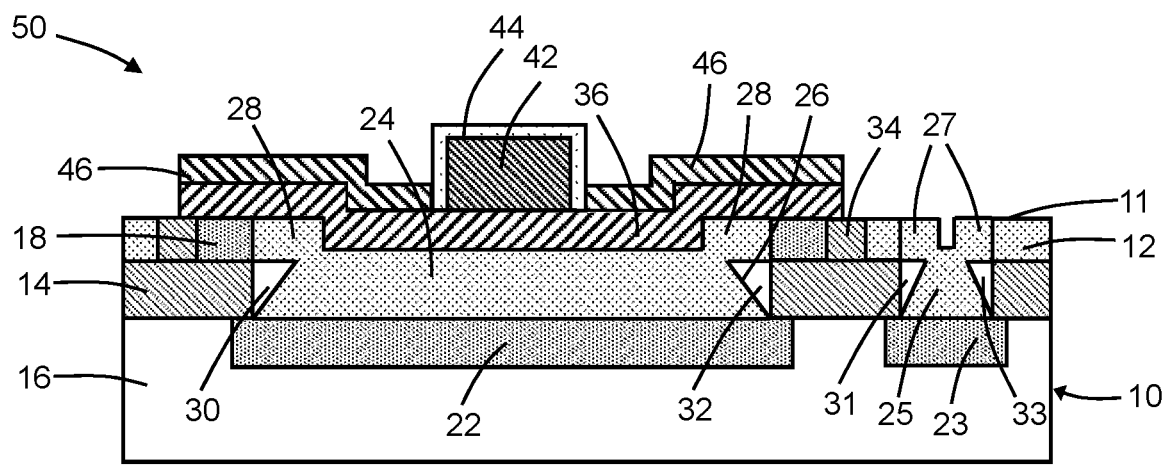
FIG. 8 is a cross-sectional view of a structure in accordance with embodiments of the invention.

With reference to FIG. 8 and in accordance with alternative embodiments, the emitter 42 may be formed with encapsulation inside of a dielectric layer 44 composed of a dielectric material, such as silicon nitride. An in situ doped semiconductor layer 46 may be epitaxially grown on sections of the base layer 36 that are not covered by the emitter 42 and dielectric layer 44. The semiconductor layer 46 may be grown selectively such that it grows only on the base layer 36 and not on dielectric surfaces, such as the dielectric layer 44. The semiconductor layer 46 may be composed of single-crystal silicon that is in situ doped with a p-type dopant, such as boron, during epitaxial growth. The semiconductor layer 46 may be formed to provide low-resistivity semiconductor material for contacting the extrinsic base 43 instead of the ion implantation (FIG. 5) into the sections 37 of the base layer 36. The extrinsic base 43 of the device structure 50 further includes the semiconductor layer 46 in addition to the sections of the base layer 36 on which the semiconductor layer 46 is grown, the sections of the device layer 12 including the doped region 18, and the semiconductor layers 28 of semiconductor material.

Figure 9:
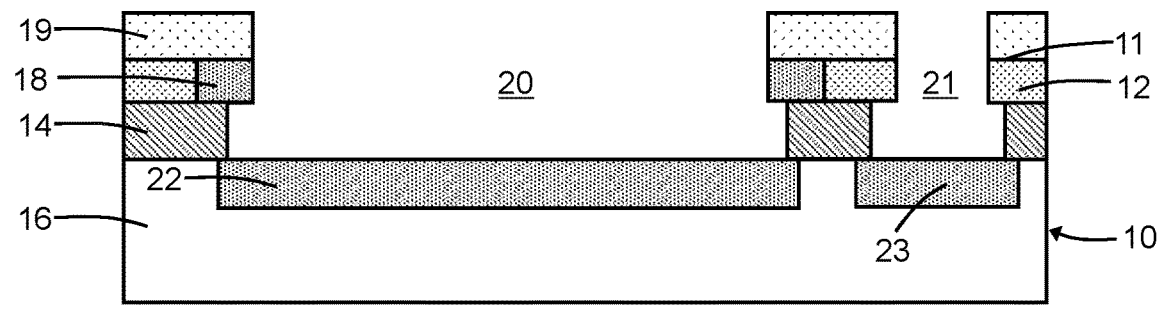
FIGS. 9-10 are cross-sectional views of a structure at successive fabrication stages of a processing method in accordance with embodiments of the invention.

With reference to FIG. 9 in which like reference numerals refer to like features in FIG. 2 and in accordance with alternative embodiments, the buried insulator layer 14 may be laterally recessed by an etching process after forming the trenches 20, 21 with straight sidewalls and before epitaxially growing the collector layer 24. The etching process may be a wet chemical etching process that etches the buried insulator layer 14 selective to the device layer 12 and the handle wafer 16. As used herein, the terms "selective" and "selectivity" in reference to a material removal process (e.g., etching) denote that the material removal rate (i.e., etch rate) for the targeted material is higher than the material removal rate (i.e., etch rate) for at least another material exposed to the material removal. The respective lower portions of the trenches 20, 21 are effectively widened in the plane of the buried insulator layer 14.

Figure 10:
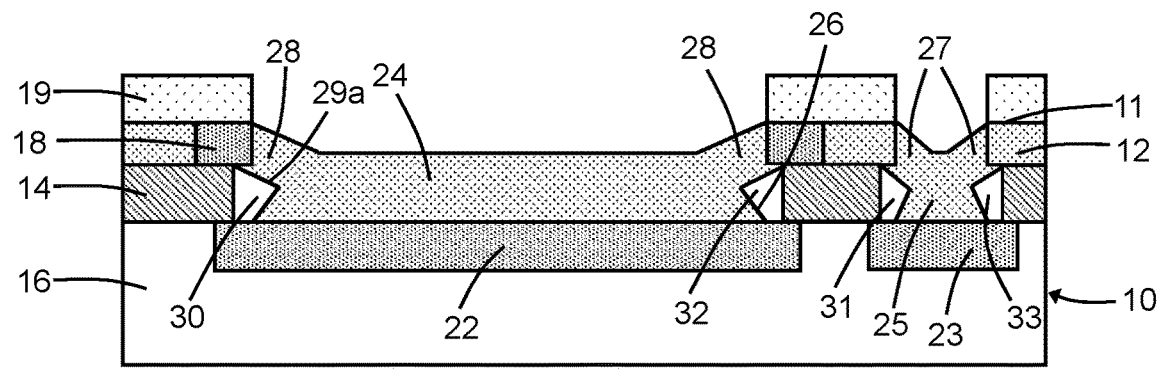

With reference to FIG. 10 in which like reference numerals refer to like features in FIG. 9 and at a subsequent fabrication stage of the processing method, the semiconductor layers 28 that epitaxially grow from the sections of the device layer 12 at the sidewalls of the trench 20 are angled relative to the plane of the device layer 12. The constraint from the recessed buried insulator layer 14 is relaxed such that a downwardly angled growth direction is permitted. The semiconductor layers 28 includes angled lower side surfaces 29a that intersect the side surfaces 26 of the epitaxially-grown collector layer 24 to define the airgaps 30, 32. The airgap 30 and the airgap 32 may have a faceted shape that, in each instance, is bounded by a side surface 26 of the collector layer 24, a side surface of the adjacent section of the buried insulator layer 14, and an angled lower side surface 29a of the semiconductor layer 28. Similarly, the semiconductor layers 27 that epitaxially grow from the sections of the device layer 12 at the sidewalls of the trench 21 are also angled and merge with the semiconductor layer 25 epitaxially growing from the handle wafer 16 to define the airgaps 31, 33 with a faceted shape.

Processing continues as described in connection with FIGS. 4-7 to complete the formation of the device structure 50.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for a heterojunction junction transistor, the structure comprising:
   a collector layer including an inclined side surface;
   a dielectric layer positioned in a lateral direction adjacent to the inclined side surface of the collector layer;
   an intrinsic base over the collector layer;
   an emitter over the intrinsic base;
   a first airgap positioned between the dielectric layer and the inclined side surface of the collector layer in the lateral direction; and
   an extrinsic base positioned in the lateral direction adjacent to the intrinsic base, the extrinsic base positioned over the first airgap,
   wherein the dielectric layer is a section of a buried insulator layer of a silicon-on-insulator substrate.

2. The structure of claim 1 wherein the extrinsic base includes a section of a device layer of the silicon-on-insulator substrate, and further comprising:
   a shallow trench isolation region extending through the device layer to the buried insulator layer, wherein the section of the device layer is laterally positioned between the shallow trench isolation region and the first airgap.

3. The structure of claim 2 wherein the extrinsic base includes a first semiconductor layer extending laterally from the section of the device layer to the inclined side surface of the collector layer, and the first semiconductor layer is coextensive with the first airgap.

4. The structure of claim 3 wherein the first semiconductor layer includes an inclined side surface that intersects the inclined side surface of the collector layer.

5. The structure of claim 3 wherein the extrinsic base includes a base layer that extends laterally over the first semiconductor layer and the section of the device layer, and the base layer comprises silicon and germanium.

6. The structure of claim 5 wherein the extrinsic base includes a second semiconductor layer on the base layer, and the second semiconductor layer has an epitaxial relationship with the base layer.

7. The structure of claim 1 further comprising:
a handle wafer having a top surface,
wherein the dielectric layer and the collector layer are positioned directly on respective portions of the handle wafer.

8. The structure of claim 7 wherein the inclined side surface of the collector layer is inclined relative to the top surface of the handle wafer.

9. The structure of claim 8 wherein the extrinsic base includes a first semiconductor layer over the first airgap, the first airgap is positioned in a vertical direction between the top surface of the handle wafer and the first semiconductor layer, and the extrinsic base includes a second semiconductor layer on the first semiconductor layer, and the second semiconductor layer comprises silicon and germanium.

10. The structure of claim 7 further comprising:
a sub-collector in the handle wafer;
a first semiconductor layer in a trench extending through a device layer of the silicon-on- insulator substrate and the buried insulator layer to the sub-collector in the handle wafer, the first semiconductor layer including an inclined side surface;
a second semiconductor layer over the first semiconductor layer, the second semiconductor layer including a side surface intersecting the inclined side surface of the first semiconductor layer; and
a second airgap positioned between the first semiconductor layer and the second semiconductor layer in a vertical direction and between the dielectric layer and the inclined side surface of the first semiconductor layer in the lateral direction.

11. The structure of claim 1 wherein the extrinsic base includes a first semiconductor layer extending laterally over the first airgap.

12. The structure of claim 11 wherein the first semiconductor layer includes an inclined side surface that intersects the inclined side surface of the collector layer.

13. The structure of claim 12 wherein the extrinsic base includes a base layer over the first semiconductor layer, and the base layer comprises silicon and germanium.

14. The structure of claim 13 wherein the extrinsic base includes a second semiconductor layer on the base layer, and the second semiconductor layer has an epitaxial relationship with the base layer.

15. The structure of claim 1 wherein the first airgap has a dielectric constant that is approximately equal to vacuum permittivity.

16. The structure of claim 1 wherein the first airgap has a substantially triangular shape.

17. The structure of claim 2 wherein the section of the device layer includes a doped region.

18. A structure for a heterojunction junction transistor, the structure comprising:
a collector layer including an inclined side surface;
a dielectric layer positioned in a lateral direction adjacent to the inclined side surface of the collector layer;
an intrinsic base over the collector layer;
an emitter over the intrinsic base;
an airgap positioned between the dielectric layer and the inclined side surface of the collector layer in the lateral direction; and
an extrinsic base positioned in the lateral direction adjacent to the intrinsic base, the extrinsic base positioned over the airgap, the extrinsic base including a first semiconductor layer extending laterally over the airgap, and the first semiconductor layer including an inclined side surface that intersects the inclined side surface of the collector layer.

19. The structure of claim 18 wherein the extrinsic base includes a base layer over the first semiconductor layer, and the base layer comprises silicon and germanium.

20. The structure of claim 19 wherein the extrinsic base includes a second semiconductor layer on the base layer, and the second semiconductor layer has an epitaxial relationship with the base layer.

* * * * *